United States Patent [19]

Yamamoto

[11] Patent Number: 5,353,306
[45] Date of Patent: Oct. 4, 1994

[54] TAP-WEIGHT CONTROLLER FOR ADAPTIVE MATCHED FILTER RECEIVER

[75] Inventor: Takeshi Yamamoto, Tokyo, Japan
[73] Assignee: NEC Corporation, Japan
[21] Appl. No.: 997,183
[22] Filed: Dec. 28, 1992

[30] Foreign Application Priority Data

Dec. 27, 1991 [JP] Japan .................................. 3-360196

[51] Int. Cl.$^5$ ............................................. H03H 7/30
[52] U.S. Cl. ................................. 375/14; 364/724.16
[58] Field of Search ............................... 375/11–12,
375/14, 96, 101, 103; 379/403, 411; 364/724.11,
724.16, 724.19, 724.2

[56] References Cited

U.S. PATENT DOCUMENTS

| | | | |
|---|---|---|---|
| 3,792,356 | 2/1974 | Kobayashi et al. | 375/14 |
| 4,550,415 | 10/1985 | Debus, Jr. et al. | 364/724.2 |
| 5,230,006 | 7/1993 | Kurokami | 375/14 |

*Primary Examiner*—Stephen Chin
*Assistant Examiner*—Young Tse
*Attorney, Agent, or Firm*—Laff, Whitesel, Conte & Saret

[57] ABSTRACT

In an adaptive matched filter with a decision feedback equalizer (DFE), a tap-weight controller of the matched filter includes a tapped delay line having a series of delay elements for receiving an incoming digital signal to produce successively delayed signals at successive taps of the delay line so that the signal at the center tap coincides with an output of the DFE. Cross-correlators are associated respectively with tap-weight multipliers of the matched filter. In each cross-correlator, cross-correlation is detected between a digital sample from the DFE and a delayed version of the corresponding digital sample. An average value is taken of the cross-correlation to produce higher significant bits of a tap-weight coefficient for the corresponding tap-weight multiplier. The most significant bit of the output of the higher significant bits is inverted and a group of bits is produced, each having the same binary value as the inverted most significant bit. The group of bits is supplied to the corresponding tap-weight multiplier as lower significant bits of the tap-weight coefficient.

2 Claims, 3 Drawing Sheets

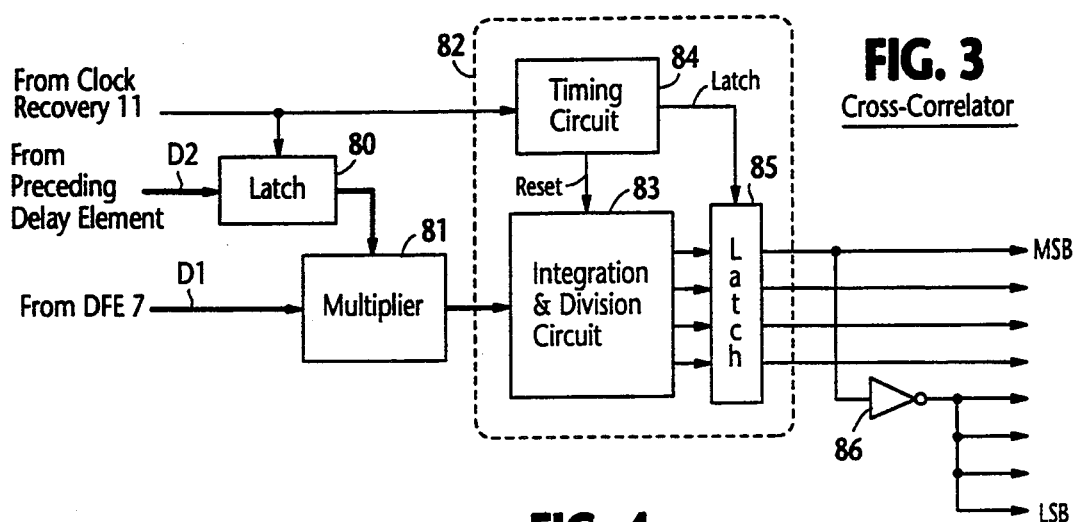
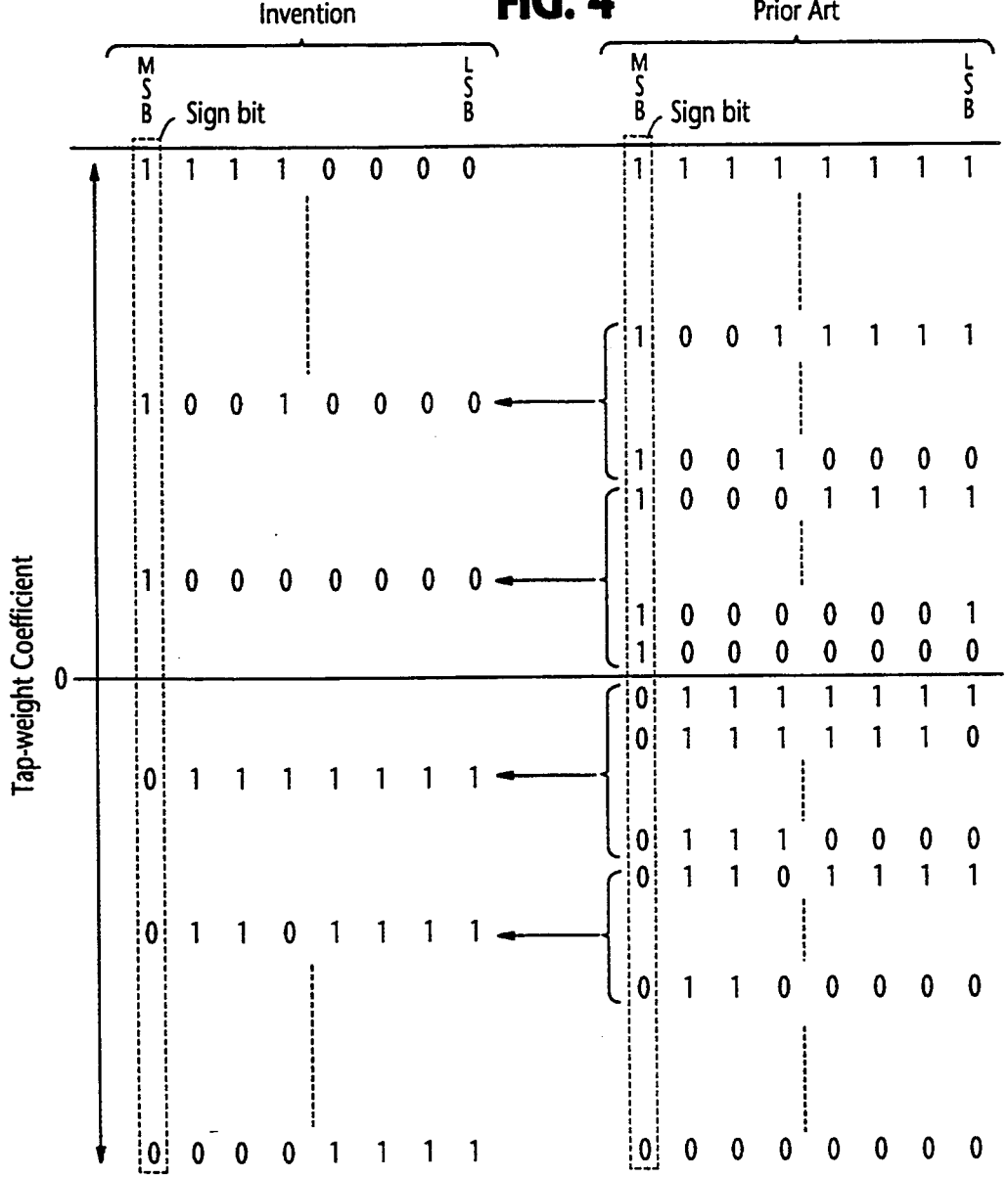

TAP-WEIGHT CONTROLLER FOR ADAPTIVE MATCHED FILTER RECEIVER

RELATED APPLICATION

The present invention is related to copending U.S. patent application 07/952,808, "Fast Response Matched Filter Receiver With Decision Feedback Equalizer", T. Yamamoto, filed Sep. 28, 1992 and assigned to the same assignee as the present invention.

BACKGROUND OF THE INVENTION

1. Field of the Invention

The present invention relates generally to equalization techniques for digital modulation such as QAM (quadrature amplitude modulation), and more specifically to a tap-weight controller of a matched filter receiver used in combination with an equalizer such as decision feedback equalizer.

2. Description of the Related Art

In digital radio transmission systems, intersymbol interference is equalized using a decision feedback equalizer when the ratio of undesired-to-desired signal ($\rho$) is smaller than 1. However, if the desired, direct-path signal arrives at a receiver later than an undesired, indirect-path signal, interference occurs between them, causing what is called multipath fading. When this occurs, the amplitude of the undesired signal is stronger than the desired signal, hence $\rho > 1$, giving rise to a large negative peak at time $t = -T$ (where T is the symbol timing) with respect to the center, positive peak at the origin of the impulse response of the transmission system, whereas, when $\rho = 0$, i.e., in the absence of the undesired component, the impulse response is symmetrical with respect to the origin. Under such circumstances, intersymbol interference cannot completely be equalized.

It is known that the transfer function of an optimum filter is the complex conjugate of the spectrum of the input signal and such a filter is called a matched filter. Since the impulse response of the matched filter is a time-reversed and delayed version of the input signal, the application of a signal whose U/D ratio is smaller than 1 to the matched filter results in the generation of two negative peaks, one at time $t = -T$ and the other at $t = T$, both having amplitudes one-half of the amplitude of the original negative peak at time $t = -T$.

A proposal has been made for using an adaptive matched filter in combination with a decision feedback equalizer in order to take advantage of the unique characteristic of the matched filter for equalizing digital signals affected during transmission by multipath fading since the two negative peaks at the output of the matched filter can be easily equalized by the decision feedback equalizer. The combined use of an adaptive matched filter and a decision feedback equalizer enables significant improvement of equalization when the later-arriving, indirect-path signal is dominant in the received signal. More specifically, the adaptive matched filter is implemented with an A/D converter for converting a demodulated incoming signal into digital samples a higher rate than the symbol rate of the incoming signal, a transversal filter and a tap-weight controller to control the tap weights of the transversal filter in an adaptive fashion in response to the output of the decision feedback equalizer. The tap-weight controller comprises a plurality of cross-correlators corresponding to the tap-weight multipliers of the transversal filter to detect cross-correlations between output digital samples of the equalizer derived from each incoming symbol and delayed versions of the corresponding digital samples supplied to the input of the adaptive matched filter. The correlation output signal from each cross-correlator has the same number of bits to represent a tap-weight coefficient as the number of quantization levels of the A/D converter. However, when the cross-correlation is low and hence satisfactory equalization cannot be expected, the lower bits of the tap-weight control signal are insignificant, and produce an undesired effect as if they were an additional source of intersymbol interference.

SUMMARY OF THE INVENTION

It is therefore an object of the present invention to provide an adaptive matched filter which eliminates additional source of intersymbol interference when successively received symbols have a low level of correlation.

According to the present invention, there is provided a receiver comprising an analog-to-digital (A/D) converter for receiving signals at a symbol rate and converting the signals into digital samples at a rate which is n times higher than the symbol rate, where n is an integer equal to or greater than 2. A transversal filter has a first tapped delay line of a series of delay elements for receiving the digital samples from the A/D converter, and a plurality of tap-weight multipliers connected respectively to successive taps of the delay line. The outputs of the tap-weight multipliers are summed to produce a matched filter output which is supplied to an equalizer, such as decision feedback equalizer, at the symbol rate. A tap-weight controller has a second tapped delay line for receiving the digital samples from the A/D converter so that the digital sample at a center tap of the second delay line is substantially time coincident with a digital sample from the equalizer. A plurality of cross-correlators are provided corresponding respectively to the tap-weight multipliers of the transversal filter, each of the cross-correlators being connected to a corresponding one of successive taps of the second delay line. Each of the cross-correlators comprises a latch for receiving a digital sample from the corresponding tap of the second delay line for latching a digital sample at the symbol rate. A multiplier is provided for multiplying the latched digital sample with the digital sample from the equalizer to produce a digital sample of a correlation value. An average circuit successively sums the digital sample from the multiplier to produce an output digital sample representing an average of summed correlation values and supplies the digital sample of the average value as higher significant bits of a tap-weight coefficient to the corresponding tap-weight multiplier. An inverter is connected to the average circuit for inverting the most significant bit of the output of the average circuit to produce a group of bits each having the same binary value as the inverted most significant bit, and supplies the group of bits to the corresponding tap-weight multiplier as lower significant bits of the tap-weight coefficient.

BRIEF DESCRIPTION OF THE DRAWINGS

The present invention will be described in further detail with reference to the accompanying drawings, in which:

FIG. 3 is a block diagram of each correlation circuit of FIG. 1; and

FIG. 4 shows relationships between the digital tap-weight coefficients of each cross-correlator of the present invention and corresponding tap-weight coefficients of a prior-art cross-correlator.

DETAILED DESCRIPTION

Figure 1:
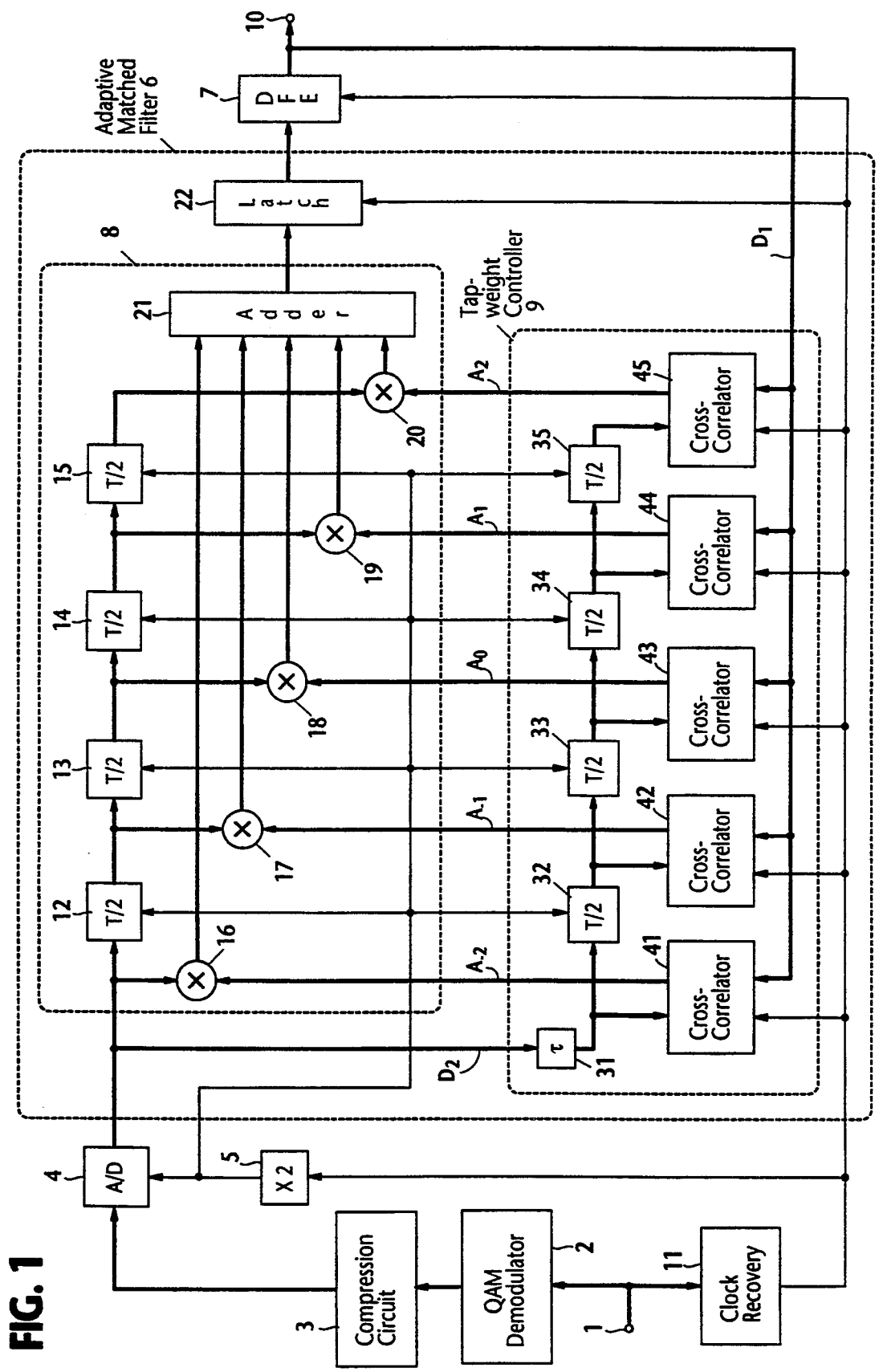
FIG. 1 is a block diagram of an adaptive matched filter receiver with a decision feedback equalizer, showing details of the adaptive matched filter.
Figure 2:
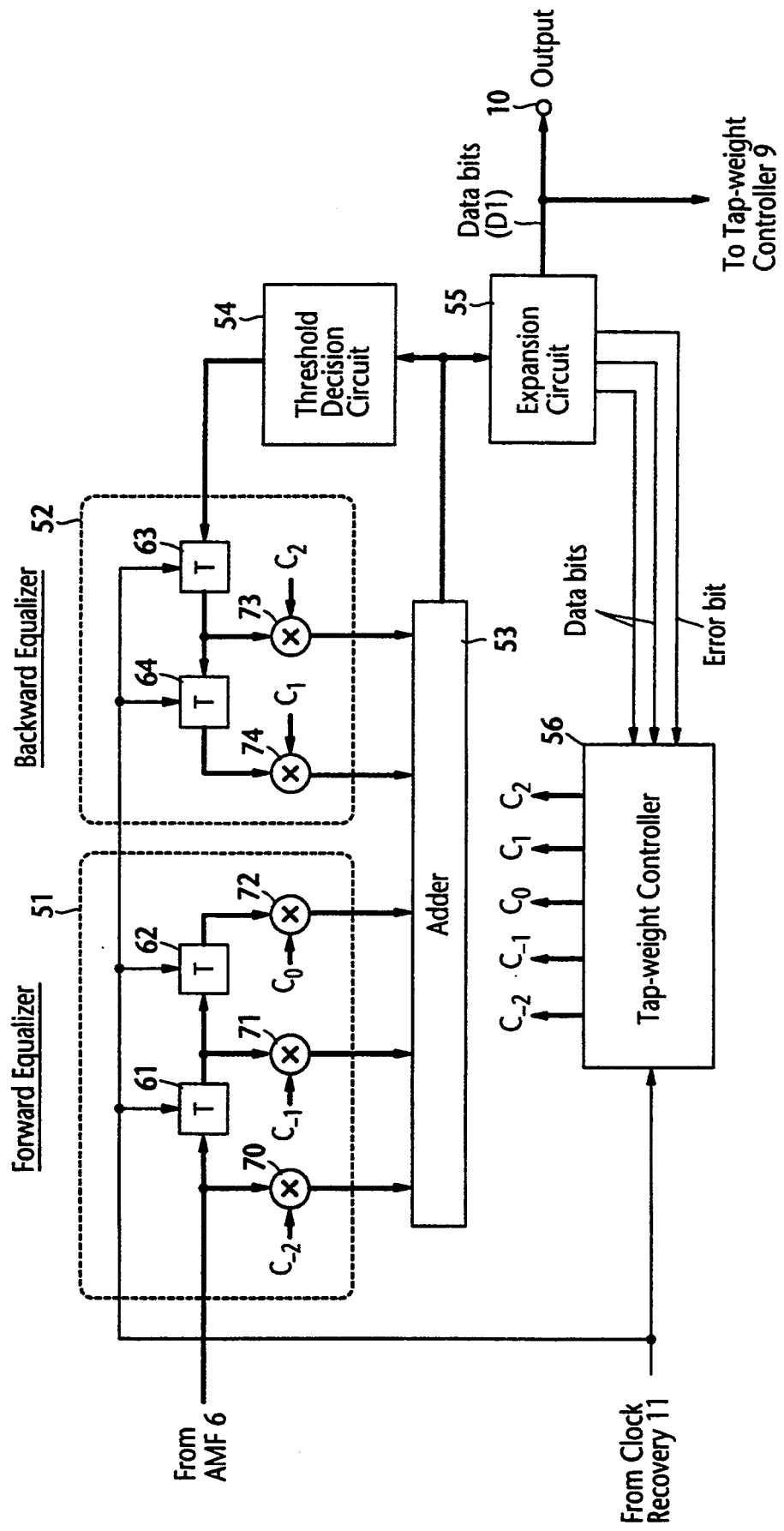
FIG. 2 is a block diagram of the decision feedback equalizer.

Referring to FIG. 1, there is shown an adaptive matched filter receiver with a decision feedback equalizer according to the present invention for digitally modulated signals (such as quadrature amplitude modulation or phase shift keying). The IF (intermediate frequency) version of a received signal is applied through an input terminal 1 to a QAM demodulator 2, such as 16-QAM demodulator, to produce a baseband signal. The amplitude range of the demodulator output is compressed by a factor K in order to conform it to the conversion range of an analog-to-digital converter 4 for purposes of digital error compensation, or equalization. A/D converter 4 is clocked by a sample pulse generator, or frequency doubler 5 at twice the symbol rate of the clock recovered by a clock recovery circuit 11. The output of the A/D converter 4 is supplied at twice the symbol rate of the baseband signal to an adaptive matched filter 6. The output of matched filter 6 is coupled to a decision feedback equalizer 7 which is clocked at the symbol rate. The adaptive matched filter 6 includes a transversal filter 8 and a tap-weight controller 9 that controls the tap-weight coefficients of the transversal filter 8.

Transversal filter 8 includes a tapped delay line formed by a series of delay elements 12, 13, 14 and 15, each being implemented by N flip-flops clocked at twice the symbol rate 1/T to successively introduce a delay time T/2 to the N-bit digital samples supplied from A/D converter 4. Successive taps of the delay line are connected respectively to tap-weight multipliers 16, 17, 18, 19 and 20. These tap-weight multipliers multiply the digital inputs from the delay line with respective tap-weight coefficients $A_{-2}$, $A_{-1}$, $A_0$, $A_1$ and $A_2$ supplied from tap-weight controller 9 to produce weighted digital signals. The outputs of the multipliers 16~20 are applied to an adder 21 where they are summed and applied to a latch 22 where the summed signal is sampled at the symbol-rate clock and applied to DFE 7.

Tap-weight controller 9 comprises a delay line connected to the output of A/D converter 4. This delay line is formed by an adjustment delay circuit 31 with a delay time $\tau$ and a series of delay elements 32, 33, 34 and 35 each being clocked at twice the symbol rate to introduce a delay time T/2, forming successive taps respectively corresponding to those of the delay line of transversal filter 8. The successive taps of the delay line of tap-weight controller 9 are connected respectively to cross-correlation circuits 41 through 45 to which the output of DFE 7 is also applied as a feedback signal.

The delay time $\tau$ is determined so that a digital sample $D_1$ from the output of DFE 7 which represents the center peak of the channel impulse response of a given incoming symbol and a corresponding digital sample $D_2$ from A/D converter 4 coincide with each other at the center tap of the delay line of transversal filter 8.

Otherwise stated, a delay time $\tau+(T/2)\times 2$ is equal to a total of the delay times of transversal filter 8 and DFE 7. As will be described, the DFE 7 operates at the symbol rate and therefore when a digital output sample $S_i$ (where i is an integer) from DFE 7 coincides with a pair of digital samples $S_{i-1}$ and $S_{i-0.5}$ from delay circuit 31. For example, for a series of digital samples $S_0$, $S_1$, $S_2$, $S_3$, and $S_4$ from DFE 7 there is a series of corresponding digital-sample pairs $(S_{-1}, S_{-0.5})$, $(S_0, S_{0.5})$, $(S_1, S_{1.5})$, $(S_2, S_{2.5})$ and $(S_3, S_{3.5})$ from delay circuit 31.

If the AMF/DFE receiver is a 16 QAM receiver, the incoming data is a sequence of 2-bit codes each having a unique signal point defined in the signal constellation diagram. The baseband analog input to the compression circuit 3 is compressed by a factor 2, for example, so that the transmitted signal points (11), (10), (01) and (00) correspond respectively to scale-down signal points (101), (100), (011) and (010) represented by the output of the A/D converter 4. The compressed analog baseband signal is converted to an N-bit digital signal by A/D converter 4. Therefore, an incoming signal which is located close to signal point (11) is converted to an N-bit code (101 xxx ... x). If the incoming signal is not affected by multipath fading, the N-bit output code of the A/D converter usually varies in a range between (101111 ... 1) and (010000 ... 0). The signal will exceed beyond this range when affected by intersymbol interference and assume a value which deviates far from this range. However, such out-of-the range digital values will be corrected by the equalization process provided by the transversal filter 8 of adaptive matched filter 6 under control of the tap-weight controller 9.

If the received signal has experienced a multipath fading during transmission, the indirect-path signal is stronger than the direct-path signal. If the indirect-path signal arrives earlier than the direct-path signal, the latter behaves as if it were an interfering signal and the resultant channel impulse response of the system is such that a large intersymbol interference occurs at a point $t = -T$ with respect to the center peak of the impulse response. The resultant channel impulse response has an asymmetrical pattern with respect to the center peak.

The delay time between successive taps of both transversal filter 8 and tap-weight controller 9 of adaptive matched filter 6 is chosen so that the asymmetrical impulse response pattern is transformed into a symmetrical pattern. To achieve this asymmetrical-to-symmetrical pattern conversion of the impulse response, the clock rate of the adaptive matched filter 6 is chosen to correspond to the timing difference between the direct- and indirect-path signals is in the neighborhood of T/2 or 3T/2 and the tap-weight coefficients $A_i$ are generated so that the energy of intersymbol interference on one side of the center peak of the channel impulse response is divided into like components and distributed equally on each side of the center peak. Specifically, the tap weight controller 9 derives tap-weight coefficients $A_i$ at time 1 from the following Equation:

$$A_i(l) = \sum_{k=l}^{l+L-1} \left\{ D_1(k) \times D_2\left(k - \frac{i}{2}\right)/L \right\}. \tag{1}$$

where, k is the digital sample supplied to each of the cross-correlation circuit 41~45.

Decision feedback equalizer 7 generally comprises a forward equalizer 51, a backward equalizer 52, an adder 53, a decision circuit 54, an expansion circuit 55 and a tap-weight controller 56. The effect of the forward equalizer 51 is to compensate for intersymbol interference that occurs under abnormal conditions where the later-arriving, indirect-path signal is dominant, while the effect of the backward equalizer 52 is to compensate for intersymbol interference that occurs under normal conditions where the early-arriving, direct-path signal is dominant. The forward equalizer 51 includes a series of delay elements 61 and 62 connected to the output of adaptive matched filter 6 and tap-weight multipliers 70, 71 and 72 connected respectively to successive taps of the delay elements 61, 62 to multiply their respective inputs with tap-weight coefficients $C_{-2}$, $C_{-1}$ and $C_0$ supplied from the tap-weight controller 56. Likewise, the backward equalizer 52 comprises a series of delay elements 63, 64 connected to the output of threshold decision circuit 54, and tap-weight multipliers 73, 74 connected respectively to successive taps of the delay elements 63, 64 to multiply their respective inputs with tap-weight coefficients $C_1$ and $C_2$ supplied from the tap-weight controller 56. All delay elements of the decision feedback equalizer 7 are clocked at the symbol rate.

The outputs of all multipliers 70~74 are summed by adder 53 and applied to threshold decision circuit 54 and expansion circuit 55. The decision circuit 54 compares the input signal with predetermined threshold values (010), (011), (100) and (101). The bits of lower significance than the least significant bit of the three-bit code are interpreted by the decision circuit 54 as a deviation of each signal from the corresponding signal point and used as error bits for backward equalization (errors arising from waveform distortion). If the received baseband signal is converted to a five-bit code (10011), it is compared with the threshold (100) and converted to a code (10010) by the decision circuit 54. The converted five-bit code is applied to as an input of the delay element 63 of the backward equalizer.

The expansion circuit 55 converts the range of N-bit digital signals to the original range in a manner inverse to that of the compression circuit 3 mentioned earlier. More specifically, the output of adder 53 is compared with the three-bit codes of the down-scaled signal points which are mapped in relation to the reduced range of input signals to produce an output so that it is scaled up to the original range. For example, a five-bit code (10011) from adder 53 is converted to a three-bit code (101). The least significant bit of the three-bit output code is used as an error bit for correcting the tap-weight values of the tap-weight controller 56. To this end, the expansion circuit 55 supplies the higher two bits of the mapped three-bit code to an output terminal 10, and supplies the higher two bits of the code as data bits and the least significant bit as an error bit to the tap-weight controller 56.

FIG. 3 shows details of each cross-correlator of the tap-weight controller 9 of the adaptive matched filter. According to the present invention, the cross-correlator comprises a latch 80 and a multiplier 81. The latch 80 of each cross-correlator is connected to a corresponding tap of the delay line formed by elements 31~3.5 to store a digital sample from the corresponding tap in response to the symbol clock from the clock recovery circuit 11. When a digital sample $D_1(k)$ is supplied from DFE 7 at time k to the multiplier 81 of each cross-correlator, digital samples $D_2(\tau+k-1)$ and $D_2(\tau+k-0.5)$ are supplied successively from the A/D converter 4 at times $(\tau+k-1)$ and $(\tau+k-0.5)$ to the delay element 31, and digital samples $D_2(k-1)$ and $D_2(k-0.5)$ are successively input to the latch 80 of the cross-correlator 41 at times $(k-1)$ and $(k-0.5)$. Since the latch 80 is clocked at symbol rate, it latches the sample $D_2(k-1)$ and supplies it to multiplier 81.

Therefore, the multiplier 81 of cross-correlator 41 generates an output $D_1(k) \times D_2(k-1)$ and the multiplier 81 of cross-correlator 42 generates an output samples $D_1(T+k) \times D_2(T+k-1)$. Likewise, the multipliers 81 of cross-correlators 43, 44 and 45 generate output samples $D_1(2T+k) \times D_2(2T+k-1)$, $D_1(3T+D_2(4T+k-1)$, respectively.

The output of the multiplier 81 of each cross-correlator is applied to an average circuit 82 which comprises an integration and division circuit 83, a timing circuit 84 and a latch 85. The correlation value represented by the digital sample from multiplier 81 is integrated and reset to zero at intervals L in response to a reset pulse supplied from timing circuit 84 to produce an N-bit integrated value over a period $L \times T$. An average value of the integrated value is obtained by utilizing those digits of the N-bit value which are shifted from the most significant bit by an amount corresponding to the integer L in a manner well known in the computation of binary digital signals. The average circuit 82 produces an (N/2)-bit code by adopting the higher N/2 bits of the average value. If the N-bit digital average value is an eight-bit word, the higher four bits of the value are stored in latch 85 in response to a latch enable pulse from the timing circuit 84 that is generated immediately following the rest pulse. The first to fourth bits of an averaged correlation value are output from latch 85 of each cross-correlator to the corresponding tap-weight multiplier of the transversal filter 8 as the first to fourth bits of a tap-weight coefficient.

According to the present invention, the first (MSB) bit of the tap-weight coefficient is inverted by an inverter 86 and the fifth to eighth bits of the average value are produced, each of the fifth to eighth bits having the same binary value as the inverted MSB. The fifth to eighth bits of each cross-correlator are also supplied to the corresponding tap-weight multiplier as the fifth to eighth significant bits of the tap-weight coefficient.

The most significant bit of the outputs of each cross-correlator is used as a sign bit by the corresponding tap-weight multiplier. As illustrated in FIG. 4, the absolute value of a correlation between digital samples $D_1$ and $D_2$ varies in a positive range between (11110000) and (10000000) and varies in a negative range between (01111111) and (00001111). Therefore, when a correlation between digital samples $D_1$ and $D_2$ is low, the absolute value of the correlation is small, and the tap-weight coefficient supplied to a given tap-weight multiplier of transversal filter 8 assumes a positive value (10000000) which corresponds to a range of prior-art correlation values (10001111)~(10000000) or a negative value (01111111) which corresponds to a range of prior-art values (01111111)~(01110000). Thus, the absolute value of the tap-weight coefficient for a low level of correlation is converged to a minimum value (10000000) or (01111111). In this way, those of the tap-weight multipliers of the adaptive matched filter 6 where equalization cannot be expected any more are supplied with minimum significant values, so that additional intersymbol interference, which would otherwise occur in the prior art AMF receiver as a result of insignificant small correlation values, is avoided.

When the level of correlation is high, the prior art tap-weight coefficient would assume a value equal to or higher than (10010000) or equal to or smaller than (01101111). Whereas, the higher four bits of the tap-weight coefficient are of the significant value that adaptively controls the matched filter 6. The resolution of the tap-weight coefficient of the present invention is apparently lower than the resolution of the prior art coefficient. However, since the primary function of the adaptive matched filter 6 is to produce a time-reversed and delayed version of the input signal, resulting in a pair of symmetrically located intersymbol interferences as described above, so that the burden of forward equalizer 51 is reduced, intersymbol interference can be completely eliminated by the decision feedback equalizer 7 in so far as the low-resolution output of the adaptive matched filter 6 is within the equalization capability of the DFE 7.

The foregoing description shows only one preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A receiver comprising:

an equalizer;

analog-to-digital (A/D) converter means for receiving signals at symbol rate and converting the signals into digital samples at a rate which is n times higher than the symbol rate, where n is an integer equal to or greater than 2;

a transversal filter having a first tapped delay line of a series of delay elements for receiving the digital samples from the A/D converter means, a plurality of tap-weight multipliers connected respectively to successive taps of the delay line, and means for summing outputs of the tap-weight multipliers to produce a matched filter output and supplying the matched filter output to said equalizer at the symbol rate;

a tap-weight controller having a second tapped delay line of a series of delay elements for receiving the digital samples from the A/D converter means so that a digital sample at a center tap of the second delay line is substantially time coincident with a digital sample from the equalizer, and a plurality of cross-correlators corresponding respectively to the tap-weight multipliers of said transversal filter, each of the cross-correlators being connected to a corresponding one of successive taps of the second delay line, each of the cross-correlators comprising:

latch means for receiving a digital sample from the corresponding tap of the second delay line and latching the digital sample at the symbol rate;

a multiplier for multiplying the latched digital sample with the digital sample from the equalizer to produce a digital sample of a correlation value;

averaging means for successively summing the digital sample from the multiplier to produce an output digital sample representing an average of a summed correlation values and supplying the output digital sample as higher significant bits of a tap-weight coefficient to a corresponding one of said tap-weight multipliers; and inverter means for inverting a most significant bit of the output digital sample of the averaging means, producing a group of bits each having the same binary value as the inverted most significant bit, and supplying the group of bits to the corresponding tap-weight multiplier as lower significant bits of the tap-weight coefficient.

2. A receiver as claimed in claim 1, wherein said equalizer comprises a decision feedback equalizer clocked at the symbol rate.

* * * * *